(12) United States Patent
Choi et al.

(10) Patent No.: US 12,255,272 B2
(45) Date of Patent: Mar. 18, 2025

(54) DISPLAY DEVICE WITH A BANK PATTERN COMPRISING A SAME SEMICONDUCTOR MATERIAL AS A LIGHT EMITTING ELEMENT

(71) Applicant: Samsung Display Co., Ltd., Yongin-si (KR)

(72) Inventors: Jin Woo Choi, Yongin-si (KR); Min Woo Kim, Yongin-si (KR); Sung Kook Park, Yongin-si (KR); Dae Ho Song, Yongin-si (KR); Byung Choon Yang, Yongin-si (KR); Hyung Il Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 515 days.

(21) Appl. No.: 17/520,118

(22) Filed: Nov. 5, 2021

(65) Prior Publication Data

US 2022/0165921 A1    May 26, 2022

(30) Foreign Application Priority Data

Nov. 20, 2020 (KR) .................. 10-2020-0157075

(51) Int. Cl.
*H01L 33/54* (2010.01)
*H01L 33/00* (2010.01)
(Continued)

(52) U.S. Cl.
CPC ............ *H01L 33/54* (2013.01); *H01L 33/005* (2013.01); *H01L 33/10* (2013.01); *H01L 33/505* (2013.01);
(Continued)

(58) Field of Classification Search
CPC . H01L 33/54; H01L 33/005; H01L 2933/005; H01L 33/52; H01L 25/0753; H01L 27/156

See application file for complete search history.

(56) References Cited

U.S. PATENT DOCUMENTS 9,425,433 B2   8/2016 Aoyagi et al.
10,326,061 B2  6/2019 Lim et al.
(Continued)

FOREIGN PATENT DOCUMENTS

JP      2014-153425 A     8/2014
KR   10-2018-0017913 A    2/2018
(Continued)

OTHER PUBLICATIONS

Hsiang et al., Enhancing the Efficiency of Color Conversion Micro-LED Display with a Patterned Cholesteric Liquid Crystal Polymer Film., Nanomaterials (Basel). Dec. 5, 2020;10(12):2430. doi: 10.3390/nano10122430. PMID: 33291375; PMCID: PMC7762002. (Year: 2020).*

*Primary Examiner* — Lex H Malsawma
*Assistant Examiner* — Bruce R. Smith
(74) *Attorney, Agent, or Firm* — Womble Bond Dickinson (US) LLP

(57) ABSTRACT

A display device includes a substrate, and a display element part on the substrate, and including a light emitting element configured to emit light in a display direction, and a bank pattern that protrudes in the display direction, wherein the bank pattern and the light emitting element include a same material.

15 Claims, 12 Drawing Sheets

(51) Int. Cl.
    *H01L 33/10*     (2010.01)
    *H01L 33/50*     (2010.01)
    *H01L 33/62*     (2010.01)

(52) U.S. Cl.
    CPC ...... *H01L 33/62* (2013.01); *H01L 2933/0041* (2013.01); *H01L 2933/005* (2013.01)

(56) References Cited

U.S. PATENT DOCUMENTS

| | | |
|---|---|---|
| 12,119,368 B2 | 10/2024 | Lee et al. |
| 2018/0047880 A1* | 2/2018 | Lim ..................... H01L 27/156 |
| 2020/0212267 A1* | 7/2020 | Kwak .................... H01L 33/24 |

FOREIGN PATENT DOCUMENTS

| | | |
|---|---|---|
| KR | 10-2020-0031189 A | 3/2020 |
| KR | 10-2020-0079817 A | 7/2020 |

* cited by examiner

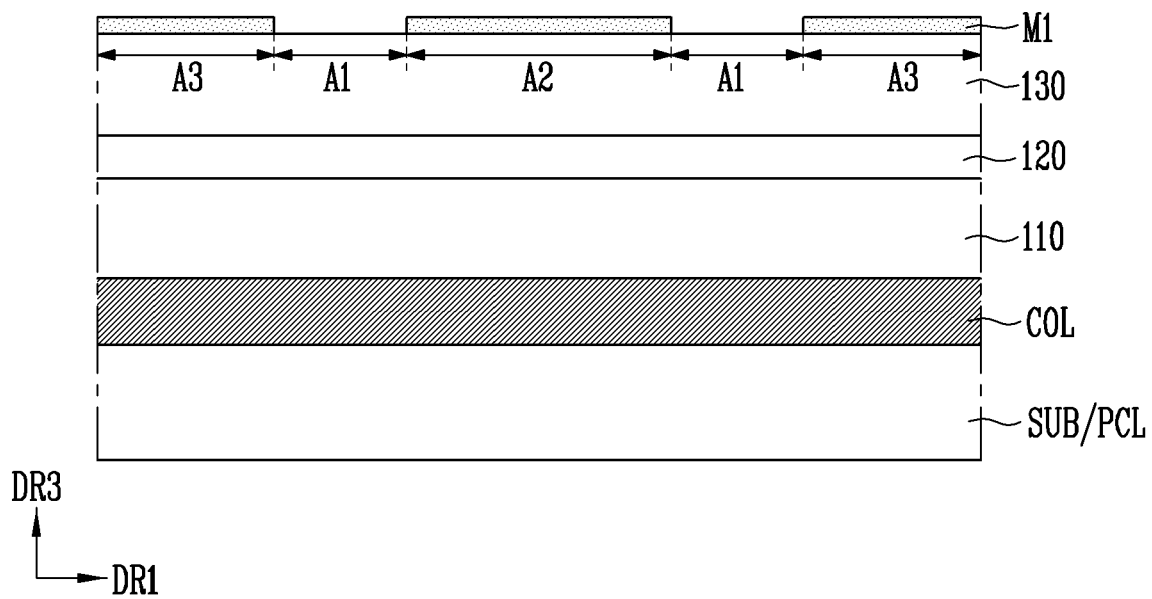
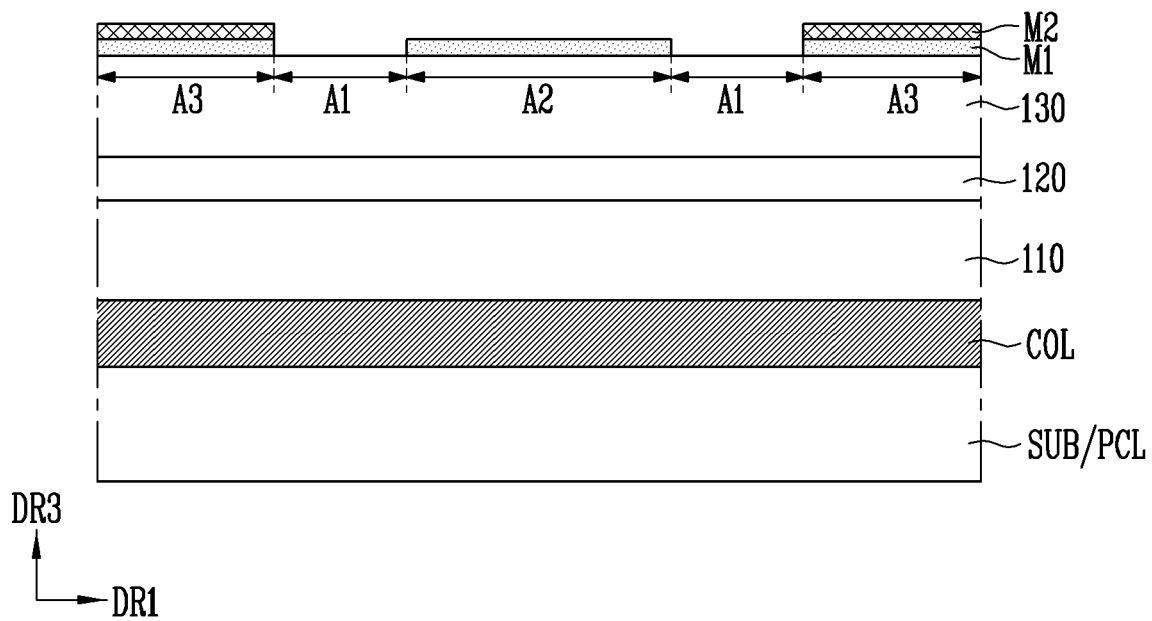

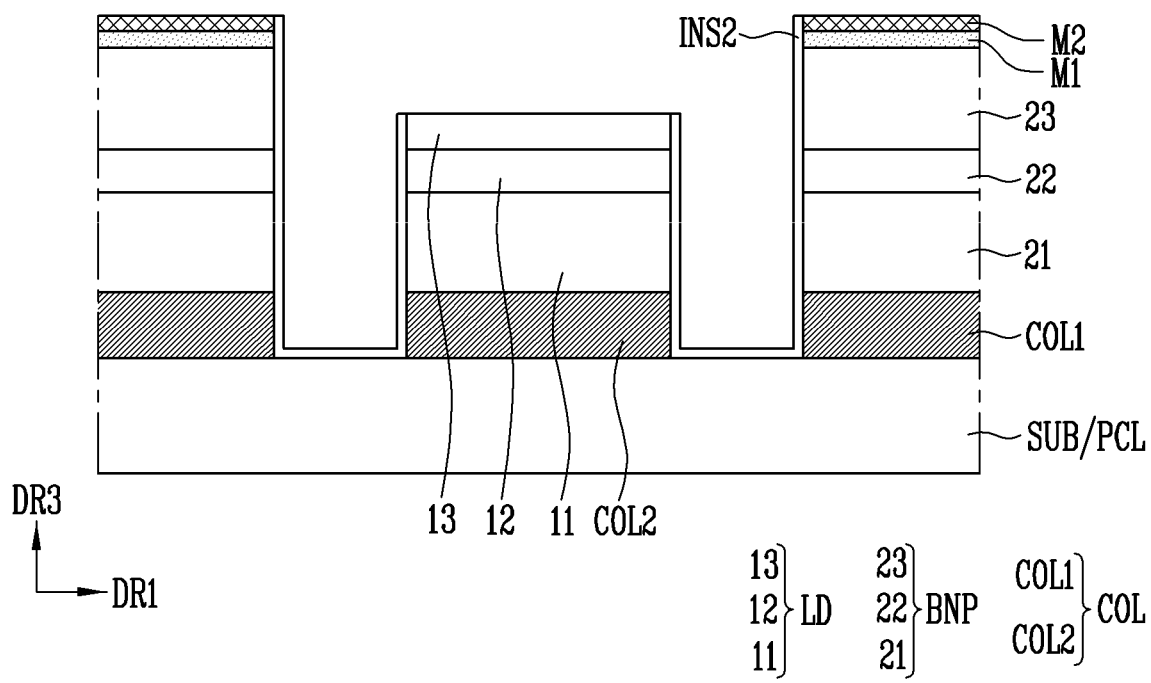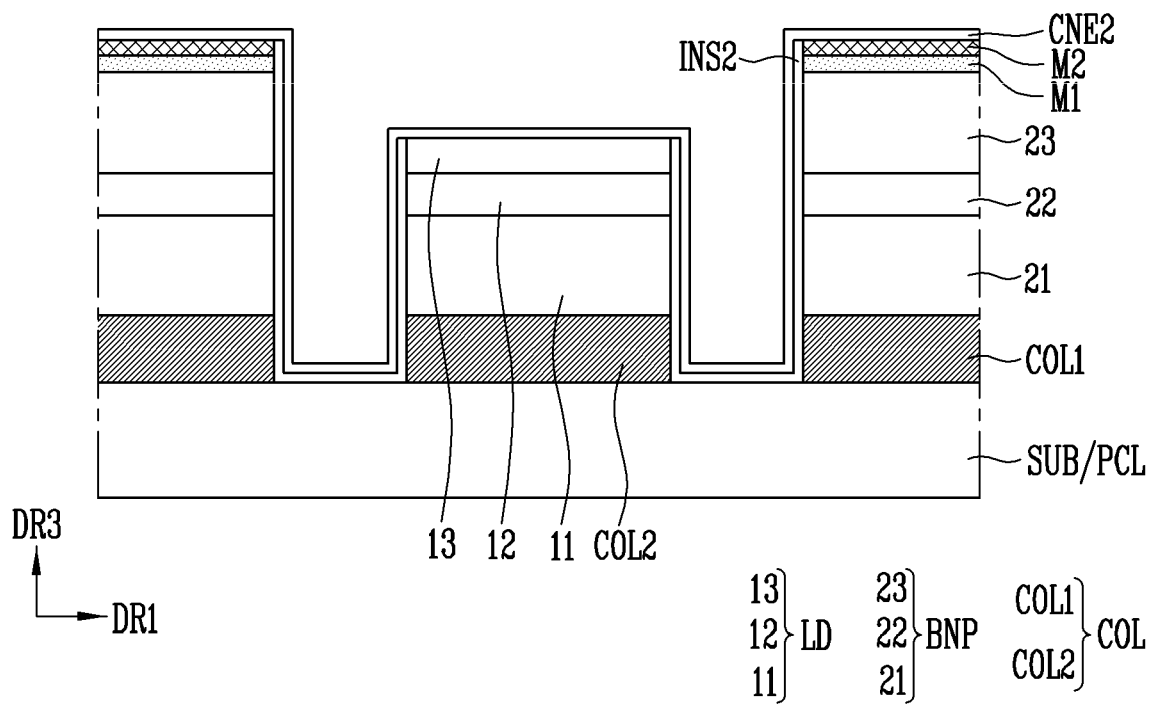

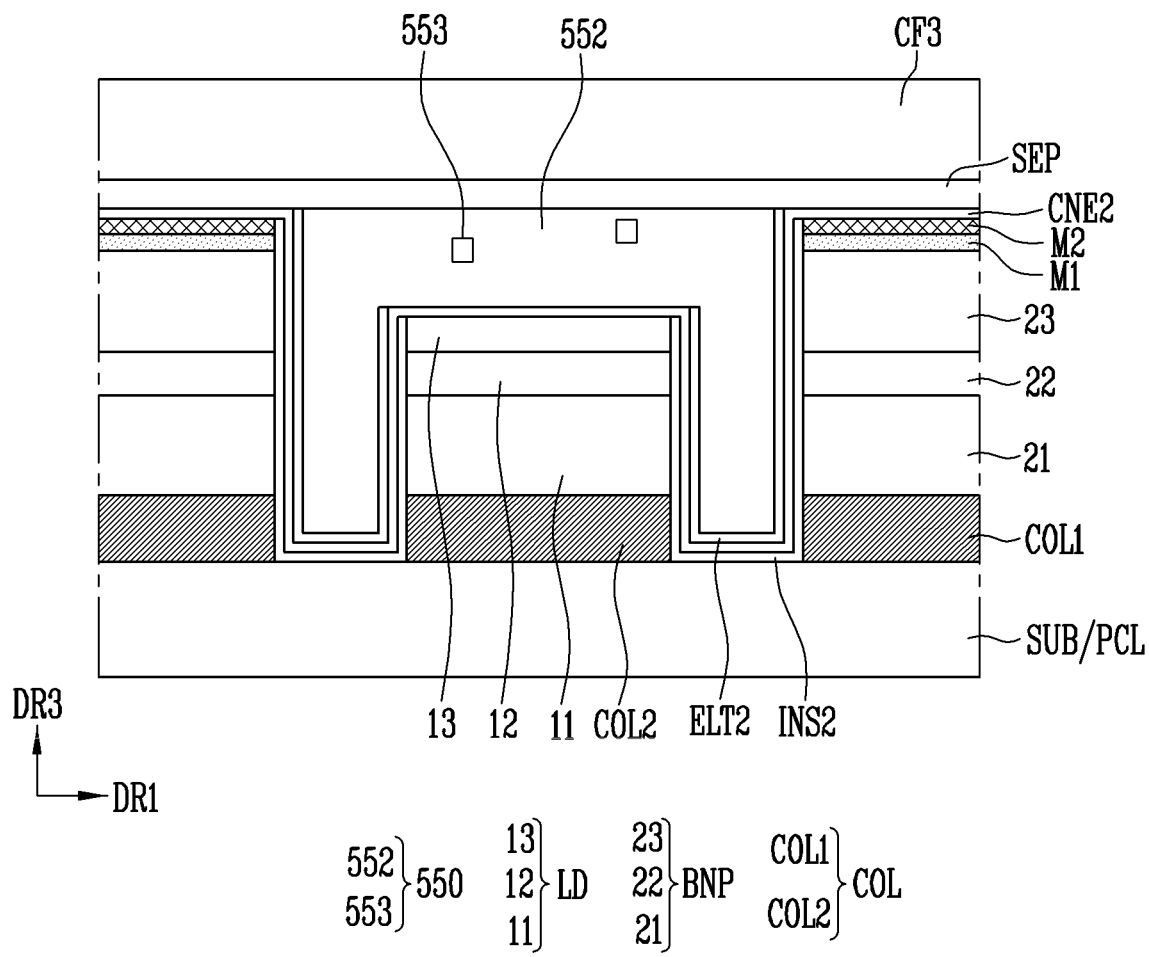

DISPLAY DEVICE WITH A BANK PATTERN COMPRISING A SAME SEMICONDUCTOR MATERIAL AS A LIGHT EMITTING ELEMENT

CROSS-REFERENCE TO RELATED APPLICATION

This application claims priority to and the benefit of Korean Patent Application No. 10-2020-0157075, filed on Nov. 20, 2020, the entire content of which is hereby incorporated by reference.

BACKGROUND

1. Field

The present disclosure relates to a display device and a manufacturing method thereof.

2. Description of the Related Art

As interest in information displays is increasing, research and development for display devices are continuously conducted.

SUMMARY

Aspects of embodiments of the present disclosure are directed toward a display device and a manufacturing method thereof that may reduce a process cost by simultaneously or concurrently forming a light emitting element and a partition wall around (e.g., surrounding) the light emitting element.

However, aspects of embodiments of the present disclosure are not limited to the aspects of embodiments mentioned above, and other technical aspects of embodiments may be clearly understood by a person of ordinary skill in the art from the following description.

According to some embodiments of the present disclosure, there is provided a display device including a substrate, and a display element part (e.g., a display region) on the substrate, and including a light emitting element configured to emit light in a display direction, and a bank pattern that protrudes in the display direction, wherein the bank pattern and the light emitting element include a same material.

The bank pattern may include a first semiconductor pattern including a first semiconductor material of a first type, a second semiconductor pattern including a second semiconductor material of a second type different from the first type and an intermediate pattern between the first semiconductor pattern and the second semiconductor pattern and including a set or predetermined material.

The light emitting element may include a first semiconductor layer including the first semiconductor material, a second semiconductor layer including the second semiconductor material, and an intermediate layer between the first semiconductor layer and the second semiconductor layer and including the set material.

The display device may further include a connection part on the substrate and including a metal.

The connection part may include a first connection part between the bank pattern and the substrate, and a second connection part between the light emitting element and the substrate.

The first connection part may be electrically open with respect to the light emitting element.

The display device may further include a transistor that is connected to the light emitting element by the second connection part.

The first semiconductor pattern may be combined with the first connection part, and the first semiconductor layer may be combined with the second connection part.

The display device may further include a color convert part including a wavelength conversion pattern, wherein the wavelength conversion pattern may be between adjacent bank patterns.

The display device may further include a first light emitting area from which light having a first color is outputted, a second light emitting area from which light having a second color is outputted, and a reflector that may be located within the first light emitting area and may be configured to reflect light having the second color.

The reflector may not be located within the second light emitting area.

The reflector may be configured to reflect light having a wavelength of about 450 nm to about 495 nm.

The display device may further include a reflective partition wall that may be located at a side surface of the bank pattern and may be configured to reflect light emitted from the light emitting element in the display direction.

The display device may further include a color filter part on the color convert part, wherein the color filter part may include a first color filter that is located within the first light emitting area and is configured to transmit the first color, and a second color filter that is located within the second light emitting area and is configured to transmit the second color.

According to other embodiments of the present disclosure, there is provided a manufacturing method of a display device, the method including preparing a stacked substrate and a target substrate, providing a first semiconductor stacked part including a first type of semiconductor material on the stacked substrate, providing an intermediate stacked part on the first semiconductor stacked part, providing a second semiconductor stacked part including a semiconductor material of a second type different from the first type on the intermediate stacked part, providing a connection part on the target substrate, combining the second semiconductor stacked part with the connection part, and etching the connection part, the first semiconductor stacked part, the intermediate stacked part, and the second semiconductor stacked part.

The connection part, the first semiconductor stacked part, the intermediate stacked part, and the second semiconductor stacked part may include a first area, a second area, and a third area, wherein the etching may include a first etching task of etching the first area to a first depth, and a second etching task of etching the second area to a second depth smaller than the first depth, wherein the third area may not be etched, and the etching may provide a light emitting element in the second area and a bank pattern in the third area.

The light emitting element and the bank pattern may be formed in a same process.

The manufacturing method of the display device may further include depositing an insulation film to cover at least an upper portion of the light emitting element, and removing the insulation film at the upper portion of the light emitting element.

The manufacturing method of the display device may further include providing a wavelength conversion pattern between adjacent bank patterns, and sealing the wavelength conversion pattern.

The manufacturing method of the display device may further include providing a reflector on the wavelength conversion pattern, the reflector including a distributed Bragg reflector.

According to the aspects of embodiments of the present disclosure, it is possible to provide a display device and a manufacturing method thereof that may reduce a process cost by simultaneously or concurrently forming a light emitting element and a partition wall around (e.g., surrounding) the light emitting element.

The aspects of embodiments of the present disclosure are not limited to the above-described aspects of embodiments, and other aspects of embodiments will be clearly understood by a person of ordinary skill in the art from the present specification and the accompanying drawings.

BRIEF DESCRIPTION OF THE DRAWINGS

FIGS. 4-18 are cross-sectional views illustrating process tasks of a manufacturing method of a display device, according to some embodiments of the present disclosure.

DETAILED DESCRIPTION

Figure 1:
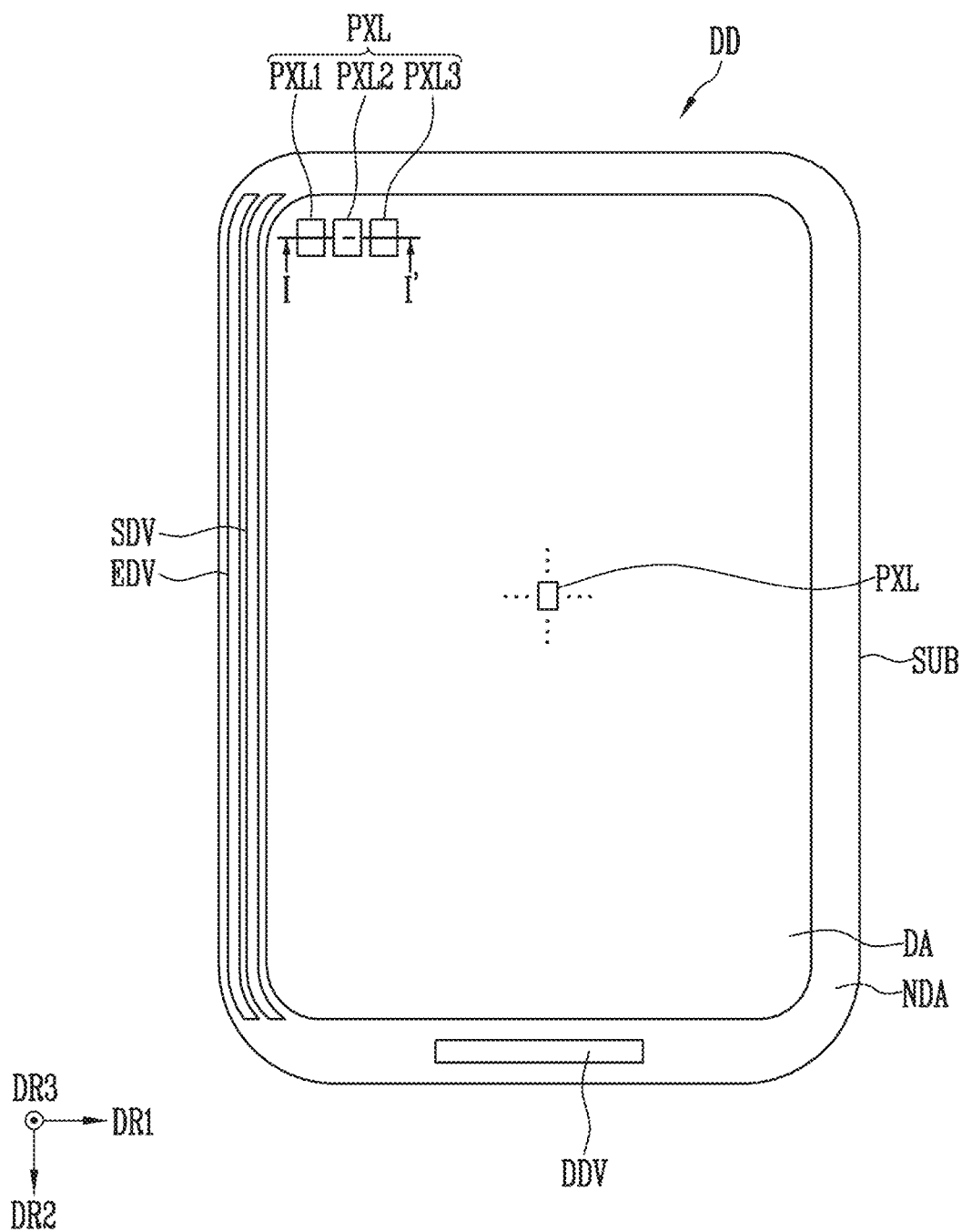
FIG. 1 is a schematic top plan view illustrating a display device, according to some embodiments of the present disclosure.

Because the embodiments described in the present specification are intended to clearly explain the concept of the present disclosure to a person of ordinary skill in the art, the present disclosure is not limited to the embodiments described in the present specification, and it will be construed by a person of ordinary skill in the art that various modifications and changes may be made without departing from the spirit and scope of the present disclosure.

The accompanying drawings are provided in order to allow embodiments disclosed in the present specification to be easily understood, and the shapes shown in the drawings may be exaggerated and displayed as necessary to aid understanding of the present disclosure, so that the present disclosure is not limited to the drawings.

In describing the embodiments of the present disclosure, a detailed description of pertinent known configurations or functions may be omitted as necessary if it is deemed to make the gist of the present disclosure unnecessarily vague.

The present disclosure relates to a display device and a manufacturing method thereof.

Hereinafter, a display device according to embodiments of the present disclosure and a manufacturing method thereof will be described in more detail with reference to the accompanying drawings.

FIG. 1 is a schematic top plan view illustrating a display device, according to some embodiments of the present disclosure.

A display device DD refers to a device that may provide visual data to a user. In some embodiments, the display device DD may be a smart phone, a tablet PC, a large screen device, a mobile phone, an image phone, an electronic book reader, a desktop PC, a laptop PC, a netbook computer, a workstation, a server, a personal digital assistant (PDA), a portable multimedia player (PMP), an MP3 player, a medical device, a camera, or a wearable device, but is not limited to a specific embodiment.

Referring to FIG. 1, the display device DD may include a substrate SUB (e.g., a target substrate), a pixel PXL, drivers SDV, EDV, and DDV, and a wire part (not shown). The drivers SDV, EDV, and DDV may include (e.g., be) a scan driver SDV, a light emission driver EDV, and a data driver DDV.

The substrate SUB may include a display area DA and a non-display area NDA.

The pixel PXL may be located (or provided) on the substrate SUB. The pixel PXL may be located (or provided) within the display area DA. Light may be emitted in a third direction DR3 in the display area DA, the third direction DR3 corresponding to the plan view. The pixels PXL may be arranged in a matrix format according to a row extending along a first direction DR1 and a column extending along a second direction DR2.

The pixel PXL may include a light emitting element (see 'LD' in FIG. 2) that may emit light.

In some embodiments, two or more types (e.g., suitable kinds) of pixels PXL that are to emit light of different colors may be located (or provided) in the display area DA. For example, the pixel PXL may include a first pixel PXL1 (e.g., a first sub-pixel PXL1) that is to emit light of a first color, a second pixel PXL2 (e.g., a second sub-pixel PXL2) that is to emit light of a second color, and a third pixel PXL3 (e.g., a second sub-pixel PXL3) that is to emit light of a third color. Any one of the first to third pixels PXL1, PXL2, or PXL3 may be located (or provided) adjacent to another one of the first to third pixels PXL1, PXL2, or PXL3 to form one pixel unit that may emit light of various colors. For example, each of the first to third pixels PXL1, PXL2, and PXL3 may be a sub-pixel that emits light of a predetermined or set color. For example, the first pixel PXL1, the second pixel PXL2, and the third pixel PXL3 may be respectively provided with a first color light emitting element, a second color light emitting element, and a third color light emitting element as a light source so that they respectively emit light of the first color, second color, and third color.

In some embodiments, the first pixel PXL1 may be a red pixel that emits red light, the second pixel PXL2 may be a green pixel that emits green light, and the third pixel PXL3 may be a blue pixel that emits blue light, but the present disclosure is not limited thereto. The color, type, and/or number of the pixels PXL forming each pixel unit are not particularly limited, and the color of light emitted by each pixel PXL may be variously changed.

The pixel PXL may include at least one light source driven by a control signal (e.g., a set or predetermined control signal) (e.g., a scan signal and a data signal) and/or a power source (e.g., a set or predetermined power source) (e.g., a first power source and a second power source). In some embodiments, each pixel PXL may be configured as an active pixel. However, the type (e.g., suitable kind), structure, and/or driving method of pixels PXL that may be applied to (e.g., utilized or used in) the display device are not particularly limited. For example, each pixel PXL may be configured as a pixel of a passive or active light emitting display device of (e.g., having) various structures and/or driving methods.

At least one of the scan driver SDV, the light emission driver EDV, or the data driver DDV may be located (or provided) within the non-display area NDA together with the wire part.

The substrate SUB may include a rigid material or a suitably flexible material depending on a purpose of the display device DD. However, the material of the substrate SUB according to the present disclosure is not limited to a specific example.

The scan driver SDV, the light emission driver EDV, and the data driver DDV may be located (or provided) within the non-display area NDA when viewed in a plan view (e.g., from the top). The scan driver SDV, the light emission driver EDV, and the data driver DDV may output electrical information that is provided to the pixel PXL. When electrical information is provided to the pixel PXL, the light emitting element LD included in the pixel PXL may emit light.

The scan driver SDV may transmit a scan signal to the pixel PXL along a scan line.

The light emission driver EDV may provide a light emission control signal to the pixel PXL through or along a light emission control line.

The data driver DDV may provide a data signal to the pixel PXL through or along a data line.

The wire part may be located (or provided) within the non-display area NDA when viewed in a plan view. The wire part may electrically connect one of the drivers to the pixel PXL.

Figure 2:
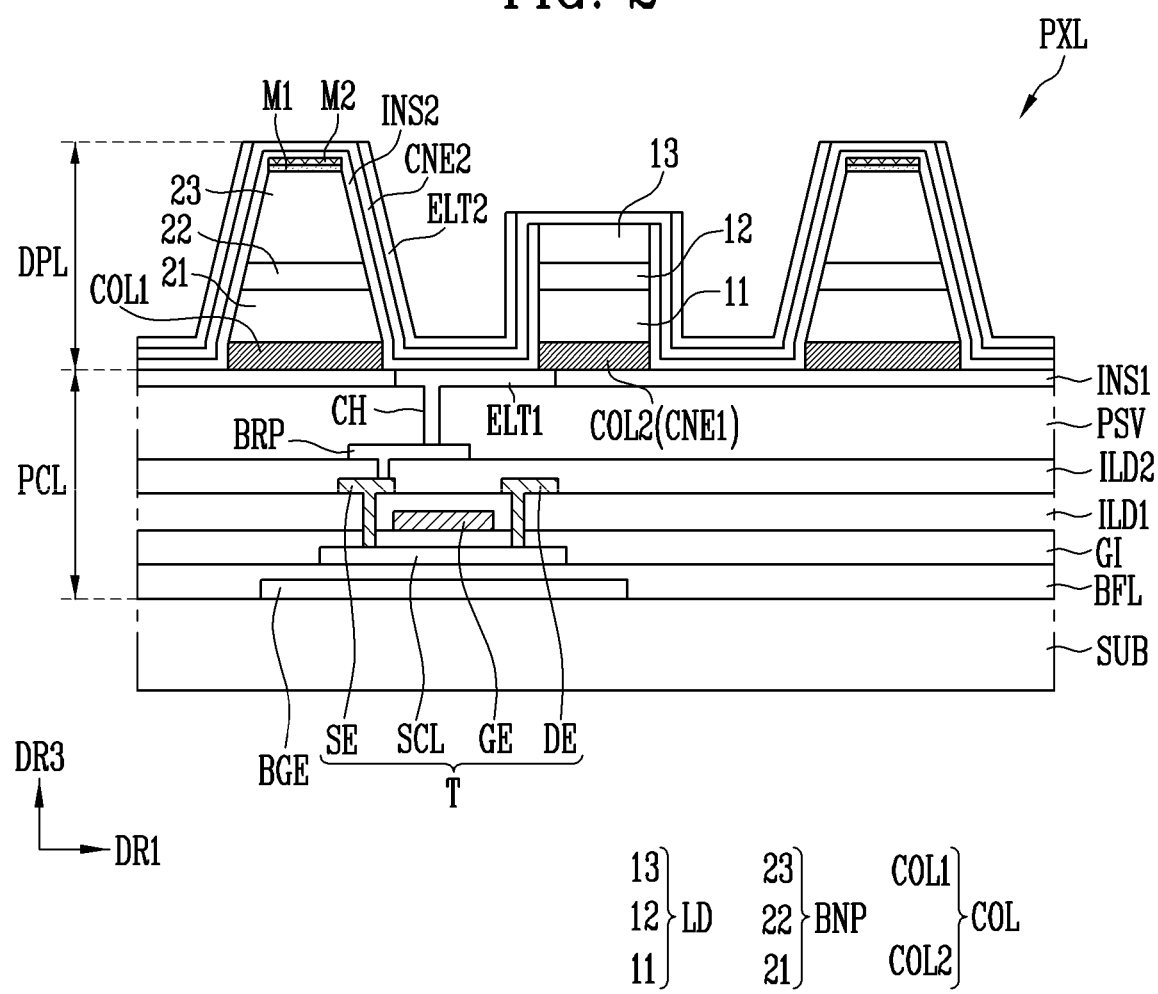
FIG. 2 is a cross-sectional view illustrating a pixel, according to some embodiments of the present disclosure.

FIG. 2 is a cross-sectional view illustrating a pixel, according to some embodiments of the present disclosure.

Referring to FIG. 2, the pixel PXL may include the substrate SUB, a pixel circuit part PCL, and a display element part (e.g., a display region) DPL.

The substrate SUB may include (e.g., be) a rigid or suitably flexible substrate. In some embodiments, the suitably flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, or cellulose acetate propionate. However, the material of the substrate SUB applied to the embodiment of the present disclosure is not limited to a specific example.

The pixel circuit part PCL may be located (or provided) on the substrate SUB. The pixel circuit part PCL may include a buffer film BFL, a back gate electrode BGE, a transistor T, a gate insulation film GI, a first interlayer insulation film ILD1, a second interlayer insulation film ILD2, a bridge pattern BRP, a contact hole CH, a passivation film PSV, a first electrode ELT1, and a first insulation film INS1.

The buffer film BFL may be located (or provided) on the substrate SUB. The buffer film BFL may prevent, or reduce the occurrence of, impurities from being diffused from the outside. The buffer film BFL may include at least one suitable metal oxide such as a silicon nitride (SiNx), a silicon oxide (SiOx), a silicon oxynitride (SiOxNy), and/or an aluminum oxide (AlOx).

The back gate electrode BGE may be located (or provided) on the substrate SUB. At least a portion of the back gate electrode BGE may be covered by the buffer film BFL. The back gate electrode BGE may overlap a gate electrode GE when viewed in a plan view.

The transistor T may be a thin film transistor. The transistor T may be a driving transistor. The transistor T may include a semiconductor layer SCL, a gate electrode GE, a source electrode SE, and a drain electrode DE.

The semiconductor layer SCL may be located (or provided) on the buffer film BFL. The semiconductor layer SCL may include at least one of polysilicon, amorphous silicon, or an oxide semiconductor.

The semiconductor layer SCL may include a first contact area contacting the source electrode SE and a second contact area contacting the drain electrode DE.

The first contact area and the second contact area may include (e.g., be) a semiconductor pattern doped with an impurity. An area between the first contact area and the second contact area may be a channel area. The channel area may include (e.g., be) an intrinsic semiconductor pattern in which no impurity is doped.

The gate insulation film GI may be provided at (e.g., on) the semiconductor layer SCL. The gate insulation film GI may include an inorganic material. In some embodiments, the gate insulation film GI may include at least one of a silicon nitride (SiNx), a silicon oxide (SiOx), a silicon oxynitride (SiOxNy), or an aluminum oxide (AlOx). In some embodiments, the gate insulation film GI may include an organic material.

The gate electrode GE may be located (or provided) at (e.g., on) the gate insulation film GI. A position of the gate electrode GE may correspond to a position of the channel area of the semiconductor layer SCL. For example, the gate electrode GE may be located (or provided) on the channel area of the semiconductor layer SCL with the gate insulation film GI interposed therebetween.

The first interlayer insulation film ILD1 may be located (or provided) at (e.g., on) the gate electrode GE. Like the gate insulation film GI, the first interlayer insulation film ILD1 may include at least one of a silicon nitride (SiNx), a silicon oxide (SiOx), a silicon oxynitride (SiOxNy), or an aluminum oxide (AlOx).

The source electrode SE and the drain electrode DE may be located (or provided) on the first interlayer insulation film ILD1. The source electrode SE may pass through the gate insulation film GI and the first interlayer insulation film ILD1 to contact the first contact area of the semiconductor layer SCL, and the drain electrode DE may pass through the gate insulation film GI and the first interlayer insulation film ILD1 to contact the second contact area of the semiconductor layer SCL. The source electrode SE may be electrically coupled (e.g., connected) to the contact hole CH through the bridge pattern BRP (e.g., the contact hole CH may include a conductive material).

The second interlayer insulation film ILD2 may be located (or provided) on or at the source electrode SE and the drain electrode DE. Like the first interlayer insulation film ILD1 and the gate insulation film GI, the second interlayer insulation film ILD2 may include an inorganic material. The inorganic material may include at least one suitable material of the first interlayer insulation film ILD1 and the gate insulation film GI, for example, a silicon nitride (SiNx), a silicon oxide (SiOx), a silicon oxynitride (SiOxNy), and/or an aluminum oxide AlOx. In some embodiments, the second interlayer insulation film ILD2 may include an organic material.

The bridge pattern BRP may be located (or provided) on the second interlayer insulation film ILD2. The bridge pattern BRP may be electrically coupled (e.g., connected) to the source electrode SE. The bridge pattern BRP may include a conductive material.

The passivation film PSV may be located (or provided) on the second interlayer insulation film ILD2. The passivation film PSV may cover the bridge pattern BRP.

The passivation film PSV may be provided in a form including an organic insulation film, an inorganic insulation film, or the organic insulation film located (or provided) on the inorganic insulation film. The passivation film PSV may include a contact hole CH to provide an electrical coupling (e.g., connection) to an area of the source electrode SE.

The contact hole CH may be formed in the same layer as the passivation film PSV. The contact hole CH may provide an electrically connection path for the transistor T and the first electrode ELT1. The contact hole CH may provide the electrical coupling (e.g., connection) to the source electrode SE through the bridge pattern BRP.

The first insulation film INS1 may be located (or provided) on the passivation film. The first insulation film INS1 may be configured to planarize an upper surface of the passivation film PSV. The first insulation film INS1 may prevent, or reduce the occurrence of, a step due to the first electrode ELT1. The first insulation film INS1 may include at least one of a silicon nitride (SiNx), a silicon oxide (SiOx), a silicon oxynitride (SiOxNy), or an aluminum oxide (AlOx).

The first electrode ELT1 may be located (or provided) on the passivation film PSV. The first electrode ELT1 may include a conductive material. The first electrode ELT1 may be a path through which an electrical signal provided from the transistor T may be provided to the display element part DPL.

The first electrode ELT1 may be electrically coupled (e.g., connected) to a portion of a connection part COL that is located (or provided) under the light emitting element LD. For example, the first electrode ELT1 may be electrically coupled (e.g., connected) to a second connection part COL2.

The first electrode ELT1 may not be electrically coupled (e.g., connected) to another portion of the connection part COL that is located (or provided) under a bank pattern BNP. For example, the first electrode ELT1 may not be electrically coupled (e.g., connected) to a first connection part COL1.

The first electrode ELT1 may physically contact the connection part COL (e.g., at the second connection part COL2). However, in some embodiments, the first insulation film INS1 may cover at least a portion of the first electrode ELT1, and in such embodiments, a contact hole (e.g., a predetermined or set contact hole) may be formed in the first insulation film INS1, so that the first electrode ELT1 and the connection part COL (e.g., the second connection part COL2) may be electrically coupled (e.g., connected) to each other through the contact hole (e.g., the predetermined or set contact hole).

The display element part DPL may be located (or provided) on the pixel circuit part PCL. The display element part DPL may include the connection part COL, the light emitting element LD, the bank pattern BNP, a second insulation film INS2, a second contact electrode CNE2, and a second electrode ELT2.

The connection part COL may be located (or provided) on the first insulation film INS1. At least a portion of the connection part COL (e.g., the second connection part COL2) may be located (or provided) so that the first electrode ELT1 is electrically connected thereto.

The connection part COL may include the first connection part COL1 and the second connection part COL2. The first connection part COL1 may be located (or provided) between the bank pattern BNP and the first insulation film INS1, and the second connection part COL2 may be positioned (e.g., located or provided) between the light emitting element LD and the first insulation film INS1.

The connection part COL may include a conductive material. The connection part COL may include metal, but is not limited thereto. A thickness of the connection part COL may be about 2 μm to about 5 μm.

The connection part COL may couple (e.g., connect) the light emitting element LD or the bank pattern BNP to the pixel circuit part PCL. The first connection part COL1 may be between (e.g., couple (e.g., connect)) the bank pattern BNP and the first insulation film INS1. The second connection part COL2 may be between (e.g., couple (e.g., connect)) the light emitting element LD and the first insulation film INS1.

The first connection part COL1 may be electrically opened with (e.g., may be electrically open with respect to) the first electrode ELT1. For example, the first connection part COL1 may measure as an open circuit with respect to the first electrode ELT1. The first connection part COL1 may not physically contact the first electrode ELT1. The first connection part COL1 may be electrically insulated from or opened with (e.g., may be electrically open with respect to) the light emitting element LD. For example, the first connection part COL1 may measure as an open circuit with respect to the light emitting element LD.

The second connection part COL2 may be electrically coupled (e.g., connected) to the first electrode ELT1. The second connection part COL2 may physically contact the first electrode ELT1. In some embodiments, as described above, the second connection part COL2 does not physically contact the first electrode ELT1, but the second connection part COL2 and the first electrode ELT1 may be electrically coupled (e.g., connected) to each other by a conductive configuration (e.g., a predetermined or set conductive configuration).

The light emitting element LD may emit light. The light emitting element LD may be a micro light emitting diode (micro LED) having a size of a micrometer (μm) unit, but is not limited thereto. The light emitting element LD may be electrically coupled (e.g., connected) to the transistor T through the second connection part COL2.

The light emitting element LD may include a first semiconductor layer 11, an intermediate layer 12, and a second semiconductor layer 13. The light emitting element LD may be a vertical light emitting diode in which the first semiconductor layer 11, the intermediate layer 12, and the second semiconductor layer 13 are sequentially stacked.

When a voltage of a threshold voltage or more is applied to respective ends of the light emitting element LD, the light emitting element LD emits light while electron-hole pairs are combined in the intermediate layer 12. By controlling the light emission of the light emitting element LD by using this principle, the light emitting element LD may be utilized (e.g., used) as a light source for various light emitting devices in addition to pixels of a display device.

The first semiconductor layer 11 may include (e.g., be) a first conductive semiconductor layer. For example, the first semiconductor layer 11 may include (e.g., be) a first type of semiconductor material (e.g., a P-type semiconductor). For example, the first semiconductor layer 11 may include a semiconductor material of one of InAlGaN, GaN, AlGaN, InGaN, AlN, or InN, and may include (e.g., be) a P-type semiconductor layer doped with a first conductive dopant such as Mg. However, the material included in the first semiconductor layer 11 is not limited thereto, and the first semiconductor layer 11 may include (e.g., be made of) various materials.

The intermediate layer 12 may be located (or provided) on the first semiconductor layer 11. The intermediate layer 12 may be located (or provided) between the first semiconductor layer 11 and the second semiconductor layer 13. A position of the intermediate layer 12 may be variously changed according to a type of the light emitting element LD.

The intermediate layer 12 may be an area in which electrons and holes are recombined. The intermediate layer 12 may have a single-quantum well or multi-quantum well structure.

The second semiconductor layer 13 may include (e.g., be) a second conductive type (e.g., suitable kind) of semiconductor layer different from the first conductive type (e.g., suitable kind) of semiconductor layer. For example, the second semiconductor layer 13 may include a second semiconductor material of a second type (e.g., an N-type semiconductor). For example, the second semiconductor layer 13 may include at least one semiconductor material of InAlGaN, GaN, AlGaN, InGaN, AlN, or InN, and may include (e.g., be) an N-type semiconductor layer doped with a second conductive dopant such as Si, Ge, and/or Sn. However, the material included in the second semiconductor layer 13 is not limited thereto, and the second semiconductor layer 13 may be formed of various materials.

In some embodiments, the light emitting element LD may further include an electrode layer. The electrode layer may reduce or minimize loss of light emitted from the intermediate layer 12 to the outside of the light emitting element LD, and may improve an effect of current spreading to the first semiconductor layer 11 or the second semiconductor layer 13.

The electrode layer may be located (or provided) on the first semiconductor layer 11 or on the second semiconductor layer 13. In some embodiments, the electrode layer may include metal or a metal oxide. In some embodiments, the electrode layer may include a transparent metal oxide such as an indium tin oxide (ITO). The electrode layer may include at least one of Cr, Ti, Al, Au, Ni, ITO, IZO, ITZO, an oxide thereof, or an alloy thereof.

The bank pattern BNP may have a shape protruding (e.g., that protrudes or extends) in the third direction DR3. The second electrode ELT2 may be a reflective partition wall. The second electrode ELT2 may be located at (e.g., arranged on) the bank pattern BNP, so that the light emitted from the light emitting element LD may be reflected in a display direction (for example, the third direction DR3), and accordingly, the light efficiency of the light emitting element LD may be improved.

The bank pattern BNP may distinguish (e.g., define a boundary between) light emitting elements LD adjacent to each other. The bank pattern BNP may be located (or provided) between the light emitting elements LD adjacent to each other.

The bank pattern BNP may include a first semiconductor pattern 21, an intermediate pattern 22, and a second semiconductor pattern 23. The bank pattern BNP may have a structure in which the first semiconductor pattern 21, the intermediate pattern 22, and the second semiconductor pattern 23 are sequentially stacked.

The bank pattern BNP and the light emitting element LD may be formed at the same time (e.g., at substantially the same time). The bank pattern BNP and the light emitting element LD may be provided during the same process. The bank pattern BNP and the light emitting element LD may include the same material.

The first semiconductor pattern 21 and the first semiconductor layer 11 may include a same material. For example, the first semiconductor pattern 21 and the first semiconductor layer 11 may include (e.g., be made of) the same material. The first semiconductor pattern 21, like the first semiconductor layer 11, may include a semiconductor material of one of InAlGaN, GaN, AlGaN, InGaN, AlN, or InN, and may include (e.g., be) a P-type semiconductor layer doped with a first conductive dopant such as Mg.

The intermediate layer 12 may include a same material (e.g., a same set or predetermined material) as the intermediate pattern 22. For example, the intermediate layer 12 may be made of the same material (e.g., the same set or predetermined material) as the intermediate pattern 22.

The second semiconductor pattern 23 and the second semiconductor layer 13 may include the same material. For example, the second semiconductor pattern 23 and the second semiconductor layer 13 may include (e.g., be made of) the same material. The second semiconductor pattern 23, like the second semiconductor layer 13, may include at least one semiconductor material of InAlGaN, GaN, AlGaN, InGaN, AlN, or InN, and may include (e.g., be) an N-type semiconductor layer doped with a second conductive dopant such as Si, Ge, and/or Sn.

A first mask M1 and a second mask M2 may be located (or provided) on the bank pattern BNP. In this case, the second mask M2 may be located (or provided) on the first mask M1. The first mask M1 and the second mask M2 may be etching masks utilized (e.g., used) in an etching process for forming the bank pattern BNP. The first mask M1 and the second mask M2 may be located (or provided) at an upper portion (e.g., the second semiconductor pattern 23) of the bank pattern BNP, so that mutual interference between the second contact electrode CNE2 and the bank pattern BNP may be prevented or reduced.

At least a portion of the second insulation film INS2 may be located (or provided) on the bank pattern BNP, the first electrode ELT1, the first insulation film INS1, or the light emitting element LD, thereby stabilizing electrical coupling (e.g., connection) and reducing external influences. The second insulation film INS2 may not be located (or provided) on at least a portion of an upper surface of the light emitting element LD. The second contact electrode CNE2 may be located (or provided) on a portion of the upper surface of the light emitting element LD in which the second insulation film INS2 is not located (or provided).

The second insulation film INS2 may form an opening so that the upper surface of the light emitting element LD is exposed. The second contact electrode CNE2 may be located (or provided) in an area corresponding to the opening formed by not disposing the second insulation film INS2 (e.g., an area of the light emitting element LD that is free of the second insulation film INS2).

The second insulation film INS2 may include at least one of a silicon nitride (SiNx), a silicon oxide (SiOx), a silicon oxynitride (SiOxNy), or an aluminum oxide (AlOx).

The second connection part COL2 may be a first contact electrode CNE1 for the light emitting element LD. As described above, the second connection part COL2 may be electrically coupled (e.g., connected) to the light emitting element LD, and may provide electrical information (e.g., may provide an electric or electronic signal) provided from the transistor T to the light emitting element LD.

The second contact electrode CNE2 may be located (or provided) to be electrically coupled (e.g., connected) to at least a portion of the light emitting element LD. At least a portion of the second contact electrode CNE2 may be located (or provided) on the second insulation film INS2, and at least another portion of the second contact electrode CNE2 may be located (or provided) on the light emitting element LD. A portion of the second contact electrode CNE2 may be located (or provided) on the second semiconductor layer 13 of the light emitting element LD.

The second contact electrode CNE2 may be electrically coupled (e.g., connected) to the light emitting element LD. For example, one end of the light emitting element LD (e.g., an end corresponding to the first semiconductor layer 11) may be electrically coupled (e.g., connected) to the second connection part COL2, and another end of the light emitting element LD (e.g., an end corresponding to the second semiconductor layer 13) may be electrically coupled (e.g., connected) to the second contact electrode CNE2.

The second contact electrode CNE2 may include a transparent metal oxide. The second contact electrode CNE2 may include at least one conductive material including an indium tin oxide (ITO), an indium zinc oxide (IZO), and/or an indium tin zinc oxide (ITZO). The second contact electrode CNE2 may include a material different from the second connection part COL2.

At least a portion of the second electrode ELT2 may be located (or provided) on the bank pattern BNP. At least a portion (e.g., a first portion) of the second electrode ELT2 may located (or provided) on one surface of the bank pattern BNP facing the light emitting element LD, another portion (e.g., a second portion) of the second electrode ELT2 may be formed along an outer circumferential surface of the light emitting element LD, and/or another portion (e.g., a third portion) of the second electrode ELT2 may be located (or provided) between the bank pattern BNP and the light emitting element LD (e.g., between the bank pattern BNP and the light emitting element LD in the first direction DR1). The second electrode ELT2 may include a reflective material. The second electrode ELT2 may reflect light emitted from the light emitting element LD in a display direction (e.g., the third direction DR3), thereby improving light efficiency of the light emitting element LD.

In some embodiments, an outer insulation film may be located (or provided) on the second contact electrode CNE2 and/or the second electrode ELT2. The outer insulation film may protect the display element part DPL from external influences. The outer insulation film, like the second insulation film INS2, may include at least one of a silicon nitride (SiNx), a silicon oxide (SiOx), a silicon oxynitride (SiOxNy), or an aluminum oxide (AlOx).

Hereinafter, a light controller LCP included in the pixel PXL will be described with reference to FIG. 3. For better understanding and ease of description, specific structures and redundant contents related to the substrate SUB, the pixel circuit part PCL, and the display element part DPL may not be provided, and a structure of the pixel PXL including the light controller LCP will be described in further detail.

Figure 3:
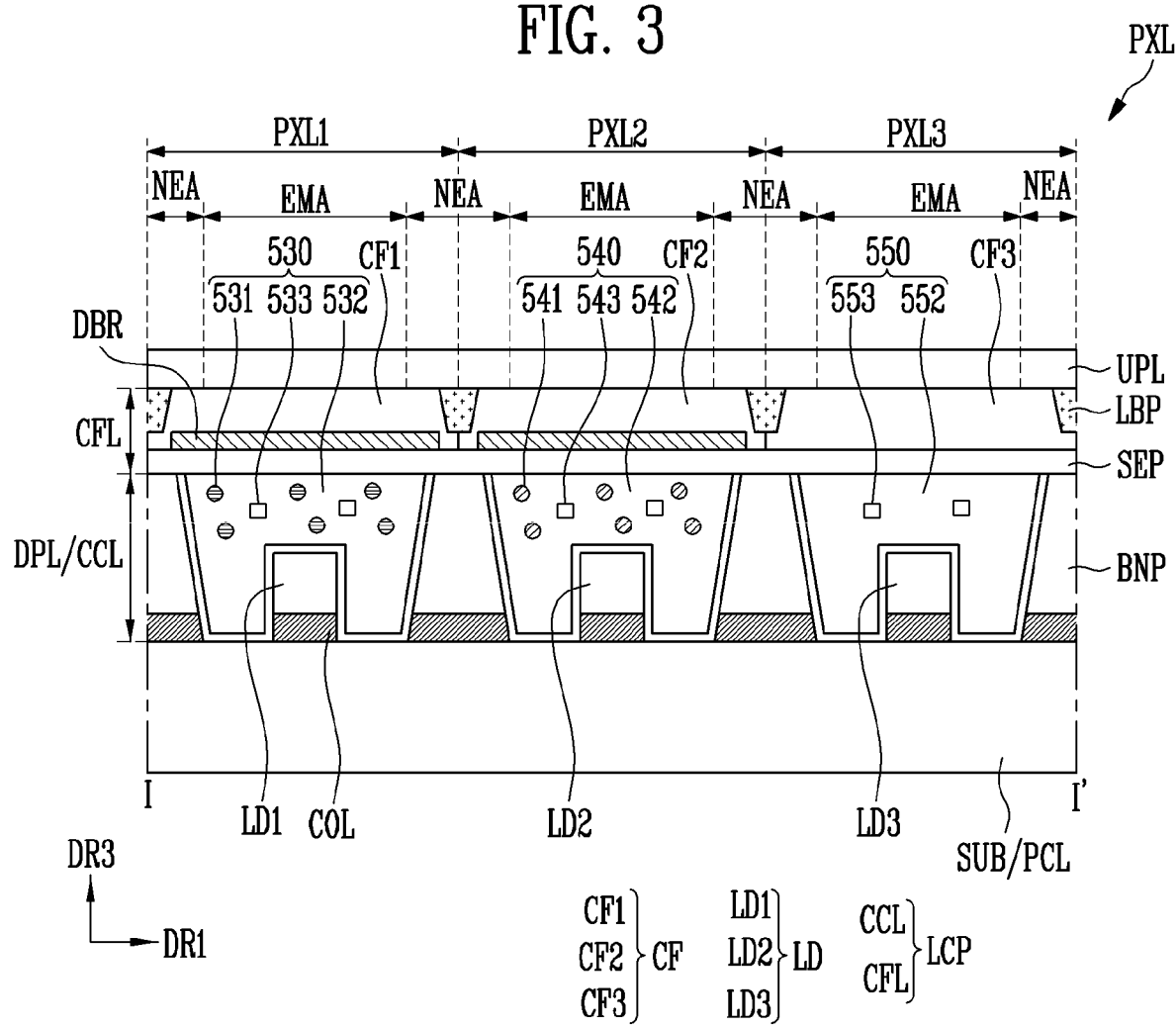
FIG. 3 is a cross-sectional view taken along line I-I' of FIG. 1, according to some embodiments of the present disclosure.

FIG. 3 is a cross-sectional view taken along line I-I' of FIG. 1, according to some embodiments of the present disclosure. Referring to FIG. 3, the pixel PXL may include the light controller LCP. The light controller LCP may include a color convert part CCL and a color filter part CFL.

The light emitting element LD may include a first light emitting element LD1, a second light emitting element LD2, and a third light emitting element LD3. The first light emitting element LD1 may be included in the first pixel PXL1. The second light emitting element LD2 may be included in the second pixel PXL2. The third light emitting element LD3 may be included in the third pixel PXL3.

The color convert part CCL may include a light transmission pattern 550 and a plurality of wavelength conversion patterns, for example, a first wavelength conversion pattern 530 and a second wavelength conversion pattern 540.

The first wavelength conversion pattern 530 may be located (or provided) within a light emitting area EMA of the first pixel PXL1 when viewed in a plan view. The light emitting area EMA may refer to an area in which light is emitted, and a non-light emitting area NEA may refer to an area in which light is not emitted.

The first wavelength conversion pattern 530 may include a first wavelength conversion material 531, a first base resin 532, and a first scatterer 533.

The first wavelength conversion material 531 may convert a peak wavelength of light applied thereto. In some embodiments, the first wavelength conversion material 531 may convert blue light into red light having a wavelength of about 610 nm to about 650 nm.

The first wavelength conversion material 531 may be a quantum dot (QD), a quantum rod, or a phosphor.

In this case, the quantum dot may refer to a particle material that emits light of a specific wavelength while electrons transition from a conduction band to a valence band. The quantum dot may be a semiconductor nano crystal material. The quantum dot may have a specific band gap according to its composition and size to absorb light and then emit light with a unique wavelength. For example, the semiconductor nano crystal of the quantum dot may include (e.g., be) a group IV nano crystal, a group II-VI compound nano crystal, a group III-V compound nano crystal, a group IV-VI nano crystal, or a combination thereof.

The first base resin 532 may have high light transmittance, and may have suitable (e.g., excellent) dispersion characteristics for the first wavelength conversion material 531. For example, the first base resin 532 may include an organic material such as an epoxy-based resin, an acryl-based resin, a cardo-based resin, or an imide-based resin.

The first scatterer 533 may have a refractive index different from that of the first base resin 532, and may form an optical interface with the first base resin 532. The first scatterer 533 may be a light scattering particle. In some embodiments, the first scatterer 533 may be a metal oxide particle or an organic particle.

The second wavelength conversion pattern 540 may be located (or provided) within a light emitting area EMA of the second pixel PXL2 when viewed in a plan view. The second wavelength conversion pattern 540 may include a second wavelength conversion material 541, a second base resin 542, and a second scatterer 543.

The second wavelength conversion material 541 may convert a peak wavelength of light applied thereto. In some embodiments, the second wavelength conversion material 541 may convert blue light into green light having a wavelength of about 510 nm to about 550 nm.

The second wavelength conversion material 541 may be a quantum dot, a quantum rod, or a phosphor.

The second base resin 542 may have high light transmittance, and may have suitable (e.g., excellent) dispersion characteristics for the second wavelength conversion material 541. For example, the second base resin 542, like the first base resin 532, may include an organic material such as an epoxy-based resin, an acryl-based resin, a cardo-based resin, and/or an imide-based resin.

The second scatterer 543 may have a refractive index different from that of the second base resin 542, and may form an optical interface with the second base resin 542. The second scatterer 543 may be a light scattering particle.

The light transmission pattern 550 may be located (or provided) within the light emitting area EMA of the third pixel PXL3 when viewed in a plan view. The light transmission pattern 550 may include a third base resin 552 and a third scatterer 553.

The third base resin 552 may have high light transmittance, and may have suitable (e.g., excellent) dispersion characteristics for the third scatterer 553. For example, the third base resin 552, like the first base resin 532, may include an organic material such as an epoxy-based resin, an acryl-based resin, a cardo-based resin, and/or an imide-based resin.

The third scatterer 553 may have a refractive index different from that of the third base resin 552, and may form an optical interface with the third base resin 552. In some embodiments, the third scatterer 553 may be a light scattering particle.

The color filter part CFL may include a sealing part SEP, a light blocking pattern LBP, a reflector DBR, and a plurality of color filters CF. The plurality of color filters CF may include a first color filter CF1, a second color filter CF2, and a third color filter CF3.

The sealing part SEP may seal the first wavelength conversion pattern 530, the second wavelength conversion pattern 540, and the light transmission pattern 550. The sealing part SEP may reduce a risk of (e.g., prevent) the first wavelength conversion pattern 530, the second wavelength conversion pattern 540, and the first light transmission pattern 550 being damaged and/or contaminated by impurities such as moisture and/or air penetrated from the outside.

The color convert part CCL may not be separated from (e.g., may be combined or integral with) the display element part DPL. The electrode configurations for (e.g., of) the first wavelength conversion pattern 530, the second wavelength conversion pattern 540, the light transmission pattern 550, and the light emitting element LD may be covered by the sealing part SEP. The sealing part SEP may include at least one of an inorganic material or an organic material. The sealing part SEP may be a single film, or may include (e.g., be) a plurality of films.

The reflector DBR may be located (or provided) on the color convert part CCL. The reflector DBR may be located (or provided) on the sealing part SEP. The reflector DBR may be located (or provided) within the first pixel PXL1 and/or second pixel PXL2 (e.g., within light emitting areas EMA of the first pixel PX1 and/or second pixel PXL2). The reflector DBR may not be located (or provided) within the third pixel PXL3 (e.g., no reflector DBR may be provided within the light emitting area EMA of the third pixel PXL3). For example, the light emitting area EMA corresponding to the third pixel PXL3 may be reflector free. The reflector DBR may reflect blue light (e.g., may not transmit blue light). The reflector DBR may transmit red light and green light. The reflector DBR may be a distributed Bragg reflector. In some embodiments, the reflector DBR may reflect light having a wavelength of about 450 nm to about 495 nm.

The reflector DBR may be located (or provided) within the light emitting area EMA of the pixels PXL that do not emit blue light, thereby enhancing color reproducibility.

For example, the reflector DBR may be located (or provided) within the first pixel PXL1 that is to emit red light. In this case, light may be outputted (e.g., output or transmitted) from the first light emitting element LD1 located (or provided) within the light emitting area EMA of the first pixel PXL1, and at least a portion of the outputted light may be changed to red light by the first wavelength conversion pattern 530 as described above. However, some of the light outputted from the first light emitting element LD1 may not be changed to red light by the first wavelength conversion pattern 530. In this case, the color reproducibility of the first pixel PXL1 may be reduced by blue light that is not changed to red light. However, because the reflector DBR may be located (or provided) within the first pixel PXL1 to reduce or prevent the unchanged blue light from being emitted to the outside (e.g., to reduce an amount of unchanged blue light emitted to the outside), a color reproducibility of the first pixel PXL1 may be improved.

In some embodiments, the reflector DBR may be located (or provided) within the second pixel PXL2 that is to emit green light. In this case, light may be outputted from the second light emitting element LD2 located (or provided) within the light emitting area EMA of the second pixel PXL2, and at least a portion of the outputted light may be changed to green light by the second wavelength conversion pattern 540 as described above. However, some of the light outputted from the second light emitting element LD2 may not be changed to green light by the second wavelength conversion pattern 540. In this case, the color reproducibility of the second pixel PXL2 may be reduced by blue light that is not changed to green light. However, because the reflector DBR may be located (or provided) within the second pixel PXL2 to reduce or prevent the unchanged blue light from being emitted to the outside (e.g., to reduce an amount of unchanged blue light emitted to the outside), a color reproducibility of the second pixel PXL2 may be improved.

The light blocking pattern LBP may be located (or provided) in the non-light emitting area NEA. The light blocking pattern LBP may be located (or provided) along a boundary of the light emitting area EMA to block light transmission. The light blocking pattern LBP may include a light blocking material. In some embodiments, the light blocking pattern LBP may include a light blocking and/or reflective material.

One (e.g., at least one) of the plurality of color filters CF may selectively transmit light having a specific wavelength, but absorb light having a wavelength different from the specific wavelength. The light passing through the one of the plurality of color filters CF may display one of primary colors such as three primary colors of red, green, and blue. However, the display color of the light passing through the one of the plurality of color filters CF is not limited to the primary colors, and the light passing through the one of the plurality of color filters CF may display one of colors of cyan, magenta, yellow, or white.

The first color filter CF1 may be located (or provided) in the light emitting area EMA of the first pixel PXL1 (e.g., the first sub-pixel PXL1). The first color filter CF1 may transmits light of a first color, and may absorb light of a second color and/or light of a third color. The first color filter CF1 may include a colorant for the first color. The first color may be red.

The second color filter CF2 may be located (or provided) in the light emitting area EMA of the second pixel PXL2 (e.g., the second sub-pixel PXL2). The second color filter CF2 may transmit light of the second color, and may absorb light of the first color and/or light of the third color. The second color filter CF2 may include a colorant for the second color. The second color may be green.

The third color filter CF3 may be located (or provided) in the light emitting area EMA of the third pixel PXL3 (e.g., the third sub-pixel PXL3). The third color filter CF3 may transmit light of the third color, and may absorb light of the first color and/or light of the second color. The third color filter CF3 may include a colorant for the third color. The third color may be blue.

An upper substrate UPL may be located (or provided) on the light controller LCP. The upper substrate UPL may include a material having light transmittance. The upper substrate UPL may be a rigid substrate or a suitably flexible substrate. In some embodiments, the upper substrate UPL may be a window member or an encapsulation substrate. In some embodiments, the upper substrate UPL may not be included in the display device.

Hereinafter, a manufacturing method of a display device according some embodiments of the present disclosure will be described with reference to FIGS. 4 to 18. FIGS. 4 to 18 are cross-sectional views of process tasks of a manufacturing method of a display device, according to some embodiments of the present disclosure.

Figure 4:
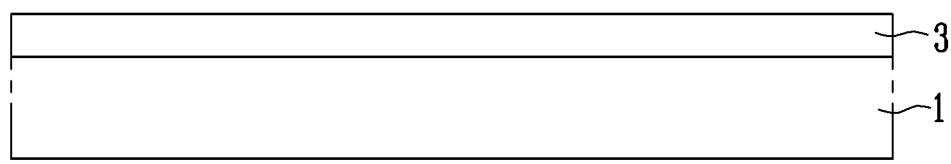

Referring to FIG. 4, a stacked substrate 1 may be prepared, and a sacrificial layer 3 may be formed on the stacked substrate 1.

The stacked substrate 1 may be a base plate for stacking target materials in preparation for combining the target materials with the substrate SUB (e.g., the target substrate). The stacked substrate 1 may be a wafer for epitaxial growth on a predetermined or set material. In some embodiments, the stacked substrate 1 may be one of a sapphire substrate, a GaAs substrate, a Ga substrate, or an InP substrate, but is not limited thereto. For example, when a specific material satisfies a selection ratio for manufacturing the light emitting element LD, and when epitaxial growth for a predetermined or set material may be smoothly generated, the specific material may be selected as the material of (e.g., for) the stacked substrate 1. A surface of the stacked substrate 1 may be flat. A shape of the stacked substrate 1 may be a polygonal shape (e.g., a rectangular shape) or a circular shape, but is not limited thereto.

The sacrificial layer 3 may be provided on the stacked substrate 1. The sacrificial layer 3 may physically separate the light emitting element LD from the stacked substrate 1 while manufacturing the light emitting element LD. The sacrificial layer 3 may include one of GaAs, AlAs, or AlGaAs. The sacrificial layer 3 may be formed by one method of a metal organic chemical vapor-phase deposition (MOCVD), a molecular beam epitaxy (MBE), a vapor phase epitaxy (VPE), or a liquid phase epitaxy (LPE). However, an operation of forming of the sacrificial layer 3 at (e.g., on) the stacked substrate 1 may be omitted depending on selection of the light emitting element LD manufacturing process.

Figure 5:
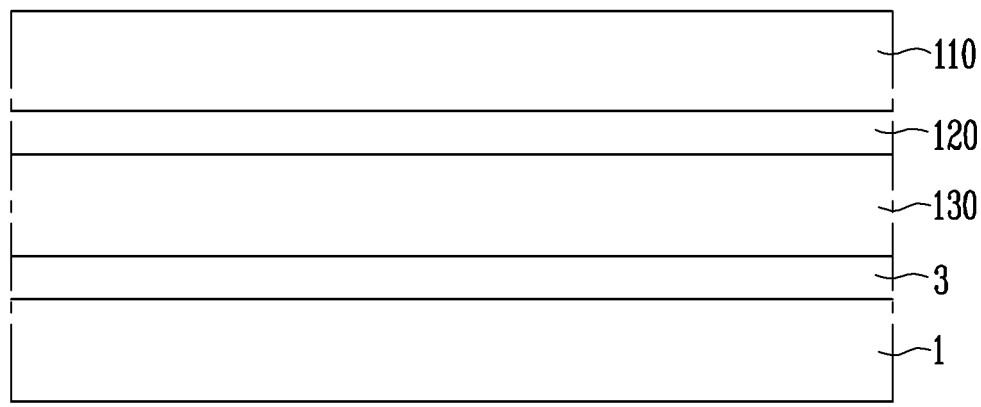

Referring to FIG. 5, a second semiconductor stacked part 130 may be formed on the sacrificial layer 3, an intermediate stacked part 120 may be formed on the second semiconductor stacked part 130, and a first semiconductor stacked part 110 may be formed on the intermediate stacked part 120. Similar to the sacrificial layer 3, the second semiconductor stacked part 130 may be formed by epitaxial growth, and may be formed by one of the methods disclosed above for forming the sacrificial layer 3. The first semiconductor stacked part 110 and the second semiconductor stacked part 130 may be formed as at least different types (e.g., different suitable kinds) of semiconductor layers. For example, the first semiconductor stacked part 110 may be a semiconductor layer of a first conductivity type (e.g., a first suitable kind of conductivity), and the second semiconductor stacked part 130 may be a semiconductor layer of a second conductivity type (e.g., a second suitable kind of conductivity) different from the first conductivity type (e.g., the first suitable kind of conductivity). The first semiconductor stacked part 110 may include (e.g., be) a first type of semiconductor material (e.g., a P-type semiconductor), and the second semiconductor stacked part 130 may include (e.g., be) a second type of semiconductor material (e.g., an N-type semiconductor). In some embodiments, an electrode layer may be formed on the first semiconductor stacked part 110.

Figure 6:
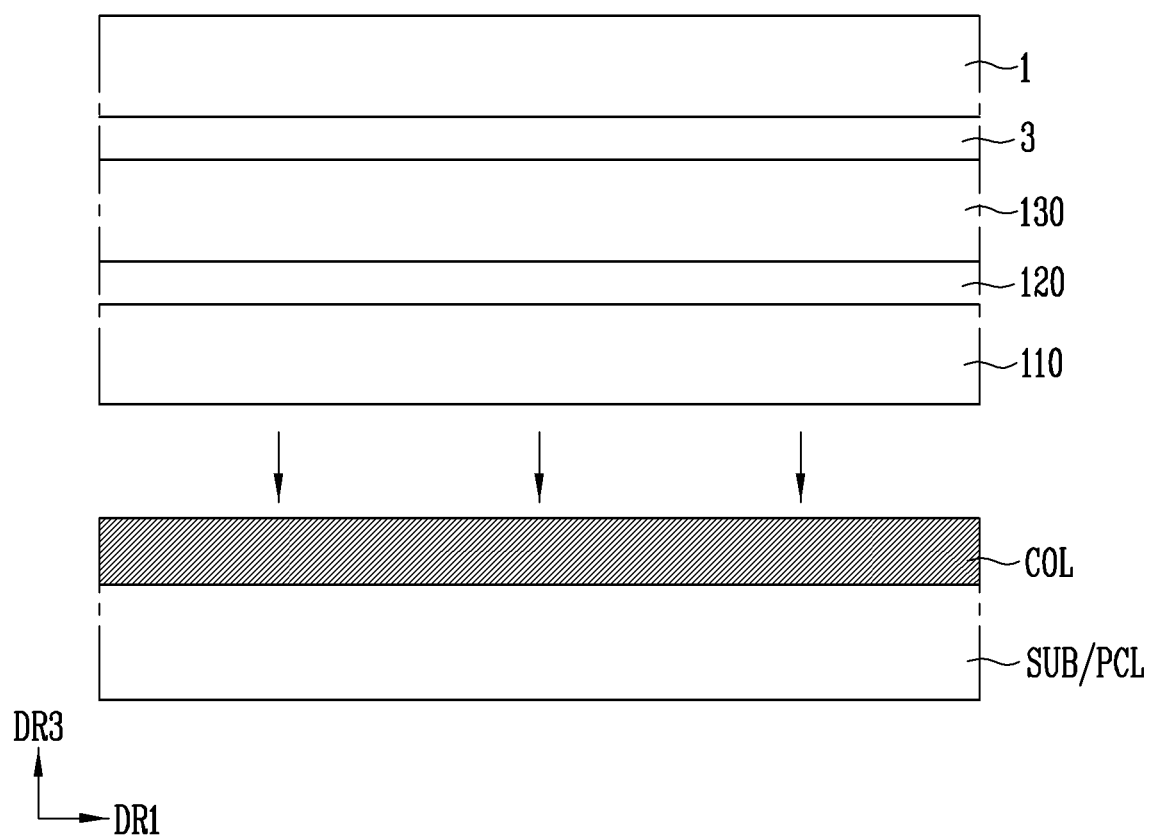
Figure 7:
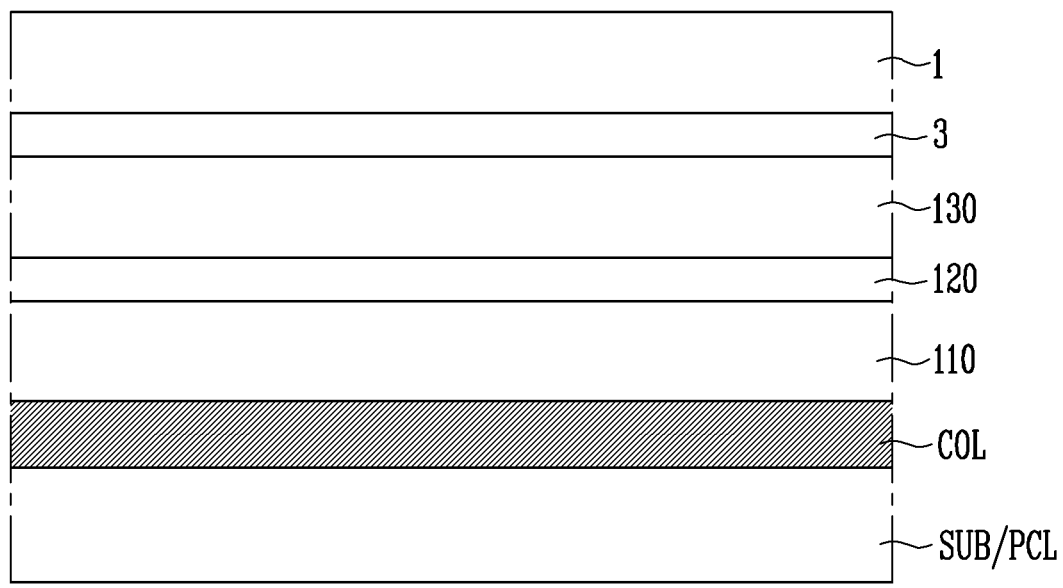

Referring to FIG. 6 and FIG. 7, the substrate SUB (e.g., the target substrate) and the pixel circuit part PCL located (or provided) on the substrate SUB may be prepared, and the connection part COL may be located (or provided) on the pixel circuit part PCL. The connection part COL may be stacked on a surface (e.g., an entire surface) of the pixel circuit part PCL. In some embodiments, the first semiconductor stacked part 110 may be coupled (e.g., connected) to or combined with the connection part COL. In some embodiments, the first semiconductor stacked part 110 and the connection part COL may be combined by a chip bonding process or a solder reflow process of assembling by using eutectic compound metal, but the present disclosure is not limited thereto.

Figure 8:
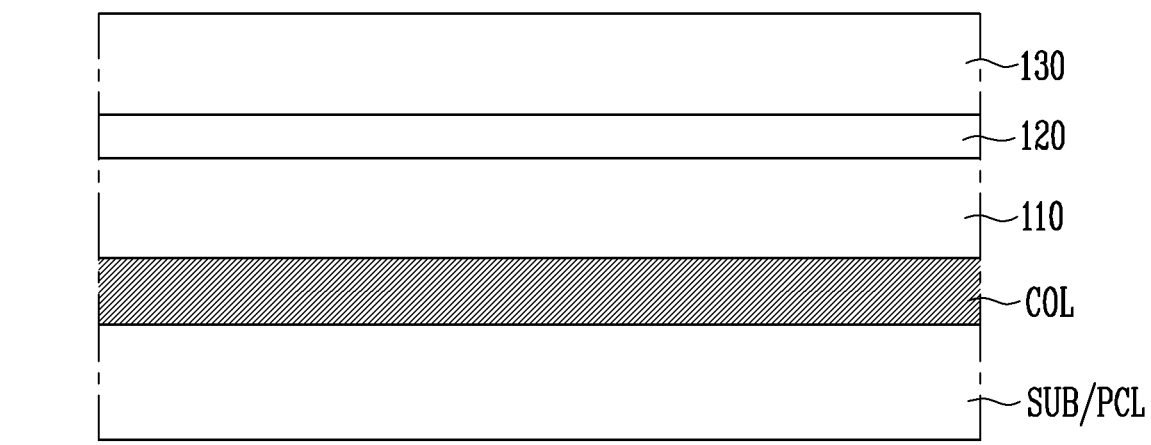

Referring to FIG. 8, the first semiconductor stacked part 110, the intermediate stacked part 120, and the second semiconductor stacked part 130 may be separated from the stacked substrate 1 and the sacrificial layer 3. In some embodiments, the first semiconductor stacked part 110, the intermediate stacked part 120, and the second semiconductor stacked part 130 may be separated by a laser lift-off (LLO) method or a chemical lift-off (CLO) method. In this case, a process of being physically separated may be performed on the second semiconductor stacked part 130.

Referring to FIG. 9 and FIG. 10, a first mask M1 may be provided on the second semiconductor stacked part 130, and a second mask M2 may be provided on a portion of the first mask M1. An area in which the first mask M1 is patterned may correspond to an area (e.g., a third area A3 and/or a second area A2) in which the bank pattern BNP and/or the light emitting element LD are to be located (or provided), when viewed in a plan view. An area in which the second mask M2 is patterned may correspond to an area (e.g., the third area A3) in which the bank pattern BNP is located (or provided), when viewed in a plan view.

The first mask M1 and the second mask M2 may have different etching selectivity. The second mask M2 may be more resistant to external influences during the etching process than the first mask M1. According to an example, the first mask M1 may include a silicon oxide (SiOx), and the second mask M2 may include nickel (Ni).

Figure 11:
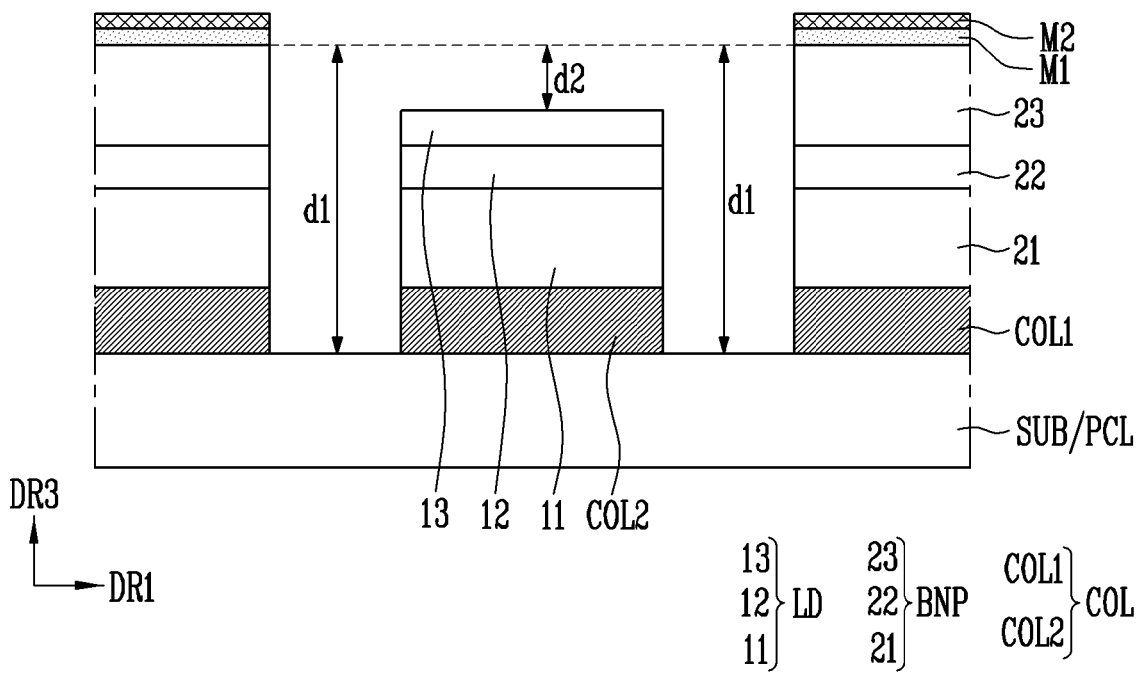

Referring to FIG. 11, an etching process may be performed on the first semiconductor stack 110, the intermediate stack 120, and the second semiconductor stack 130, by using the first mask M1 and the second mask M2 as etching masks.

An area (e.g., a first area A1) in which the first mask M1 or the second mask M2 is not patterned may be etched by (e.g., to) a first depth d1. An area (e.g., the second area A2) in which only the first mask M1 is patterned may be etched by (e.g., to) a second depth d2 smaller than the first depth. An etching process may not be performed on an area (e.g., the third area A3) in which the first mask M1 and the second mask M2 are patterned. For example, the third area A3 may be free from etching.

An etching process may be performed on the first semiconductor stacked part 110, the intermediate stacked part 120, and the second semiconductor stacked part 130 to provide the bank pattern BNP and the light emitting element LD physically spaced apart from each other. In this case, the light emitting element LD may be located (or provided) in the area (e.g., the second area A2) in which only the first mask M1 is patterned, and the bank pattern BNP may be located (or provided) in the area (e.g., the third area A3) in which the first mask M1 and the second mask M2 are patterned.

As described above with reference to FIG. 2, the bank pattern BNP may include the first semiconductor pattern 21, the intermediate pattern 22, and the second semiconductor pattern 23, and the light emitting element LD may include the first semiconductor layer 11, the intermediate layer 12, and the second semiconductor layer 13.

The first semiconductor pattern 21 and the first semiconductor layer 11 may be provided by removing a portion of the first semiconductor stacked part 110. For example, the first semiconductor pattern 21 and the first semiconductor layer 11 may include the same material.

The intermediate pattern 22 and the intermediate layer 12 may be provided by removing a portion of the intermediate stacked part 120. For example, the intermediate pattern 22 and the intermediate layer 12 may include the same material.

The second semiconductor pattern 23 and the second semiconductor layer 13 may be provided by removing a portion of the second semiconductor stacked part 130. For example, the second semiconductor pattern 23 and the second semiconductor layer 13 may include the same material.

The first mask M1 and second mask M2 may be located (or provided) on the bank pattern BNP, and the first mask M1 arranged on the light emitting element LD may be removed during the etching process such that the first mask M1 may not be located (or provided) on the light emitting element LD.

Figure 12:
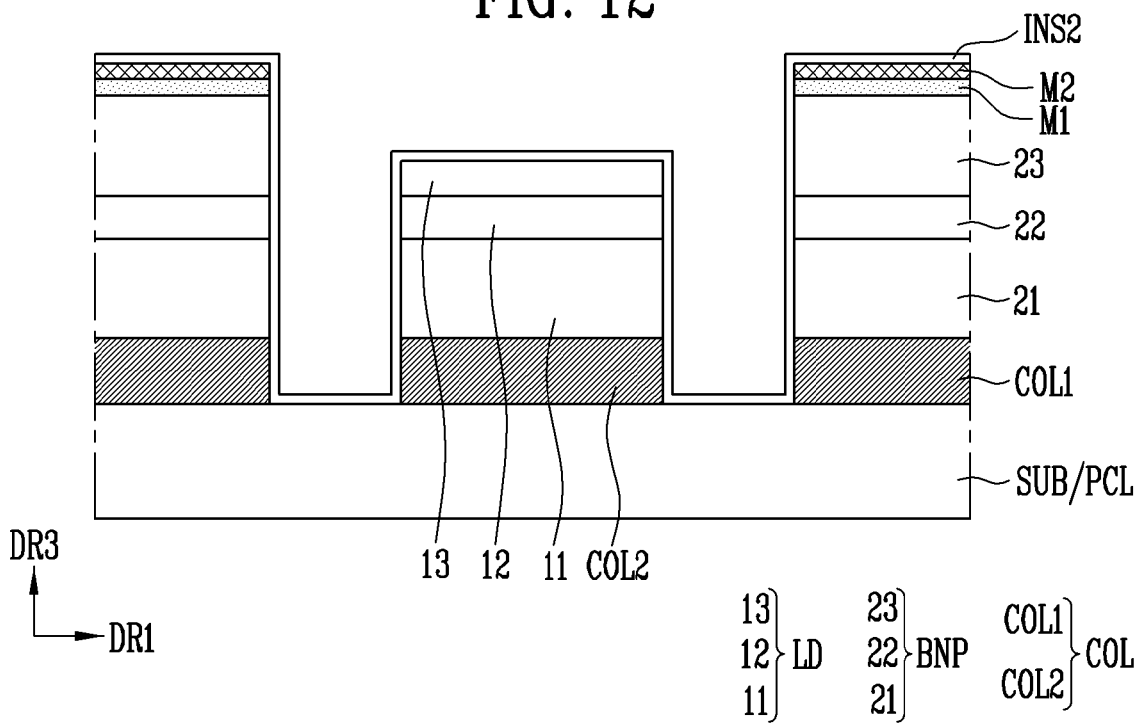

Referring to FIG. 12 and FIG. 13, the second insulation film INS2 may be located (or provided) on the bank pattern BNP and the light emitting element LD. The second insulation film INS2 may be patterned on an entire surface including the light emitting element LD and the bank pattern BNP. Then, the second insulation film INS2 located (or provided) on the light emitting element LD and the second insulation film INS2 located (or provided) on the bank pattern BNP may be removed. The second insulation film INS2 located (or provided) on the light emitting element LD is removed, such that the second semiconductor layer 13 may be exposed to the outside. In this case, a separate mask may not be required in the process of removing a portion of the second insulation film INS2.

Referring to FIG. 14, the second contact electrode CNE2 may be formed. At least a portion of the second contact electrode CNE2 may be located (or provided) to be electrically coupled (e.g., connected) to the light emitting element LD. At least a portion of the second contact electrode CNE2 may be located (or provided) on the second semiconductor layer 13 exposed to the outside after the second insulation film INS2 is removed. As described above, the connection part COL coupled (e.g., connected) to one end of the light emitting element LD may function as a contact electrode for the light emitting element LD, and the second contact electrode CNE2 coupled (e.g., connected) to another end of the light emitting element LD may function as a contact electrode for the light emitting element LD.

Figure 15:
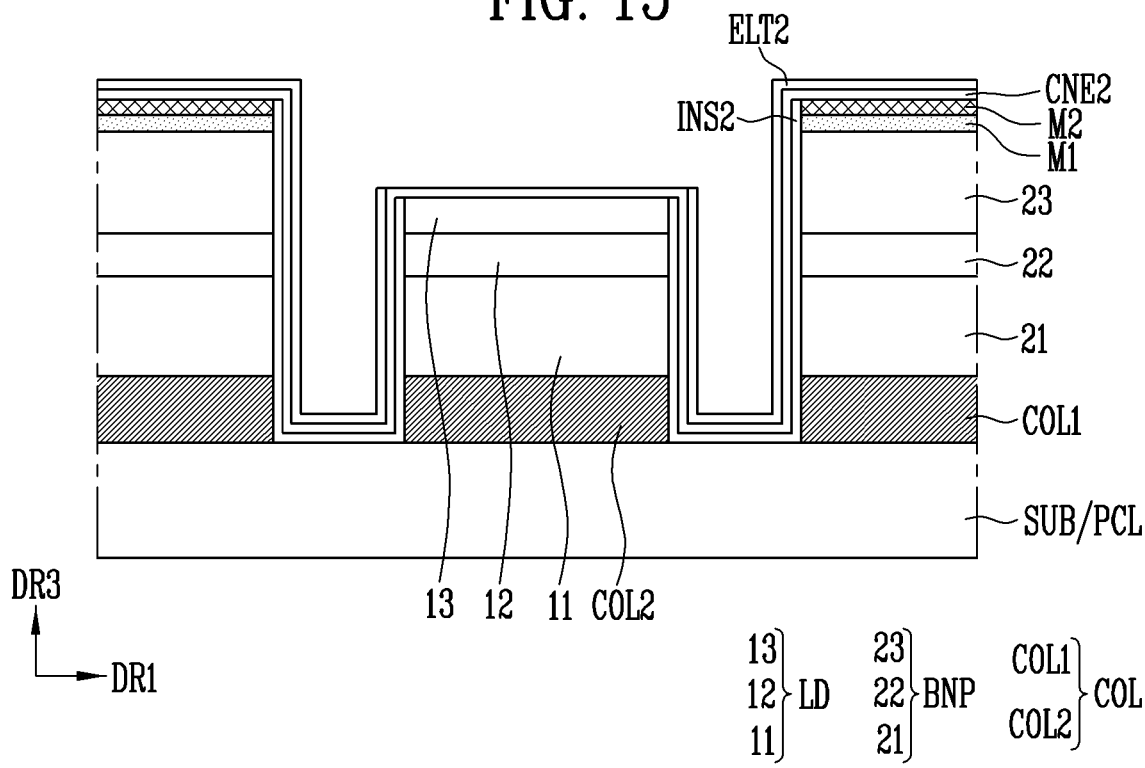
Figure 16:
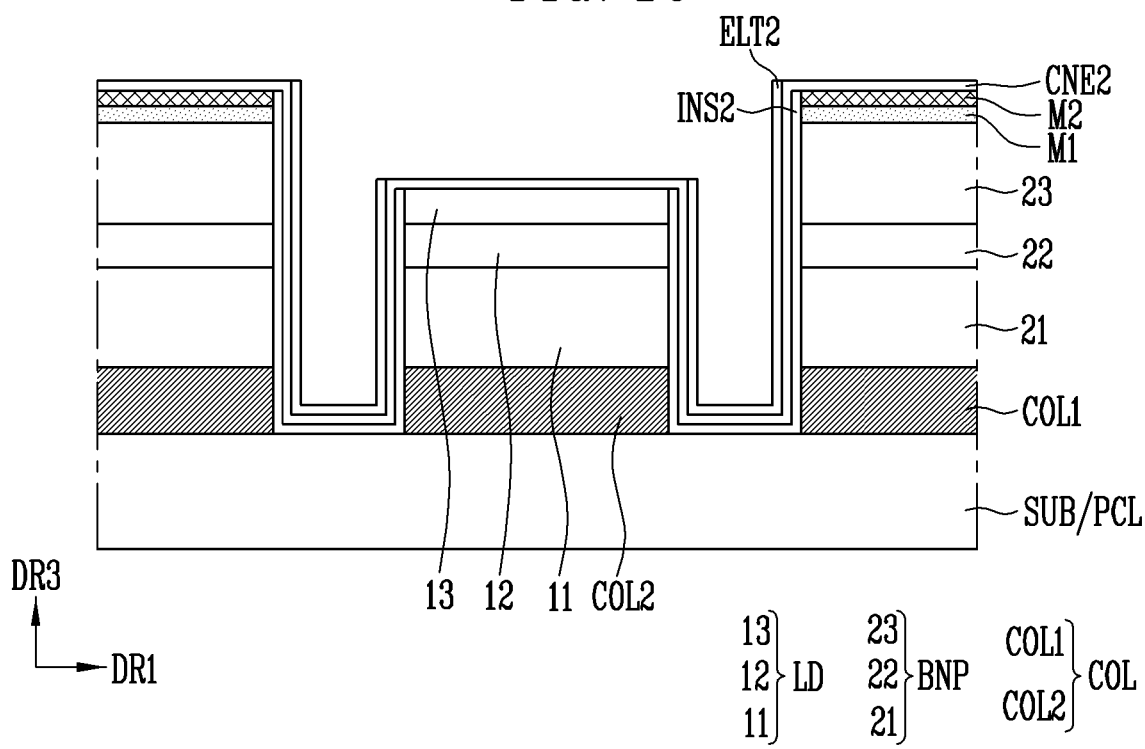

Referring to FIG. 15 and FIG. 16, the second electrode ELT2 may be formed on the second contact electrode CNE2. Then, the second electrode ELT2 located (or provided) on the bank pattern BNP and the second electrode ELT2 located (or provided) on the light emitting element LD may be removed. In this case, a separate mask may not be required for the process of removing a portion of the second electrode ELT2. At least a portion of the second electrode ELT2 may be located (or provided) at (e.g., on) one side surface of the bank pattern BNP and/or on one side surface of the light emitting element LD, thereby improving the light efficiency of the light emitting element LD.

As described above with reference to FIG. 3, the pixel PXL may include the first pixel PXL1, the second pixel PXL2, and the third pixel PXL3. In this case, the first pixel PXL1 and the second pixel PXL2 may each include the reflector DBR, and the third pixel PXL3 may not include the reflector DBR (e.g., may be reflector free).

Hereinafter, a manufacturing process for the color convert part CCL and the color filter part CFL located (or provided) on the display element part DPL will be described with reference to FIG. 17 and FIG. 18. In this case, a partial structure of the pixel PXL including the reflector DBR will be described based on the second pixel PXL2 with reference to FIG. 17. A partial structure of the pixel PXL not including the reflector DBR will be described based on the third pixel PXL3 with reference to FIG. 18.

Figure 17:
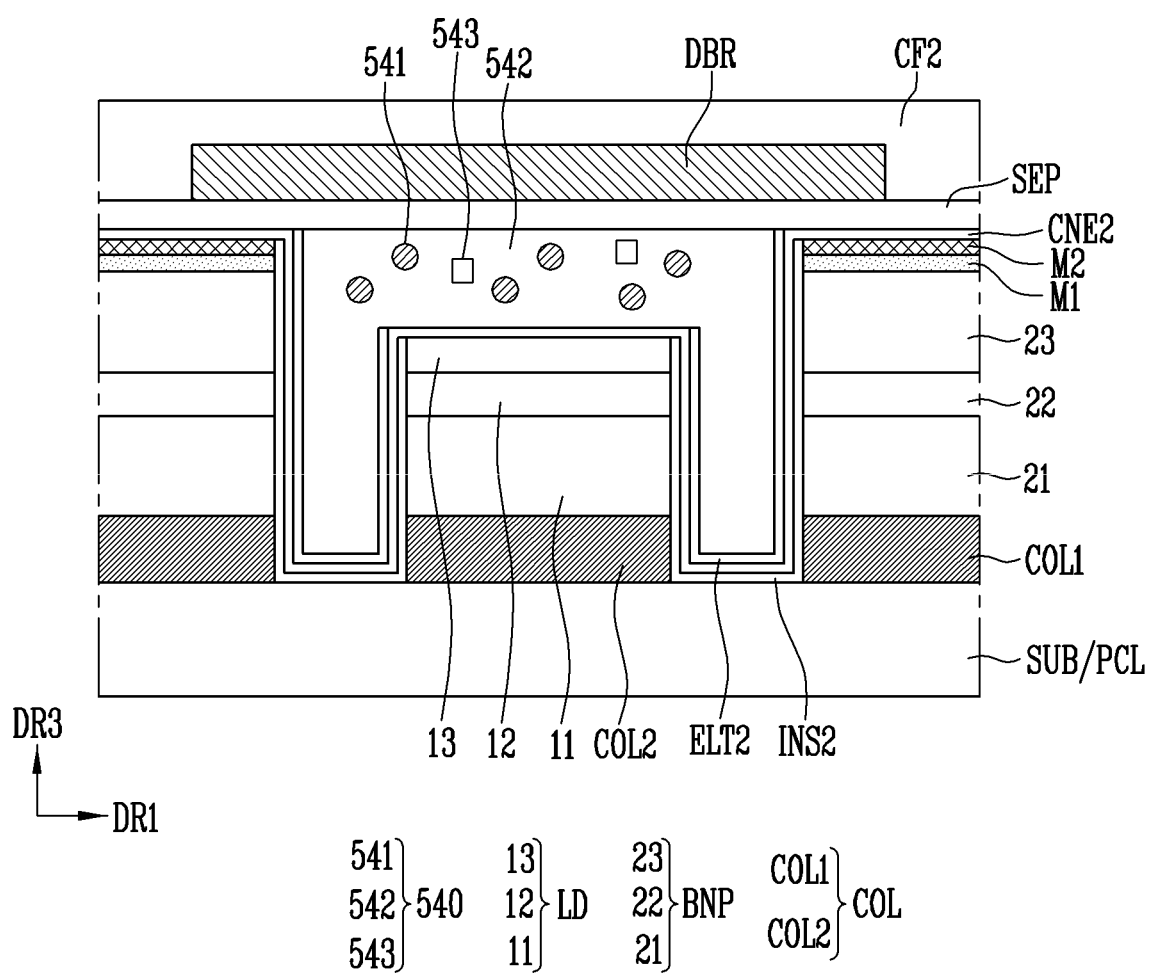

Referring to FIG. 17, the second wavelength conversion pattern 540 may be provided between bank patterns BNP. At least one (e.g., at least two) of the second wavelength conversion material 541, the second base resin 542, or the second scatterer 543 may be provided between the bank patterns BNP to be located (or provided) on a display path of light emitted from the light emitting element LD. After the second wavelength conversion pattern 540 is provided, the second wavelength conversion pattern 540 may be sealed in an area between the bank patterns BNP by using the sealing part SEP, and the reflector DBR may be located (or provided) on the sealing part SEP. In some embodiments, when the sealing part SEP is not provided, one end of the reflector DBR may be connected to one of the bank patterns BNP, and another end of the reflector DBR may be connected to another of the bank patterns BNP, so that the second wavelength conversion pattern 540 may be sealed. Then, the second color filter CF2 may be arranged on the reflector DBR. The light emitted from the light emitting element LD may pass through the second wavelength conversion pattern 540, the reflector DBR, and the second color filter CF2 to be provided to the outside. As a result, the reflector DBR may be arranged in the second pixel PXL2 to emit light having a color excluding blue light, and the light emitted from the light emitting element LD included in the second pixel PXL2 may pass through the reflector DBR.

Referring to FIG. 18, the light transmission pattern 550 may be provided between the bank patterns BNP. At least some of the third scatterer 553 and the third base resin 552 may be provided between the bank patterns BNP to be positioned on a display path of light emitted from the light emitting element LD. After the light transmission pattern 550 is provided, the light transmission pattern 550 may be sealed in the area between the bank patterns BNP by utilizing the sealing part SEP, and the third color filter CF3 may be arranged on the sealing part SEP. The light emitted from the light emitting element LD may be transmitted through (e.g., may pass through) the light transmission pattern 550 and the third color filter CF3 to be provided to the outside. To emit blue light, the reflector DBR may not be arranged in the third pixel PXL3, and the light emitted from the light emitting element LD included in the third pixel PXL3 may not be transmitted through (e.g., may not pass through) the reflector DBR.

In some embodiments, at least a portion of the light emitting element LD and at least a portion of the bank pattern BNP may be formed in a same process, so that process tasks may be reduced, and thus process cost may be reduced. In some embodiments, for example, because the process of arranging the light emitting element LD after arranging the bank pattern BNP may not be separately performed, electrical defects that may occur in the process of arranging the light emitting element LD may be prevented or reduced, and thus it is possible to obtain (e.g., more easily obtain) a fine thickness and height of the bank pattern BNP.

Herein, the use of the term "may," when describing embodiments of the present disclosure, refers to "one or more embodiments of the present disclosure." As used herein, the term "and/or" includes any and all combinations of one or more of the associated listed items. As used herein, the singular forms "a," "an," and "the" are intended to include the plural forms as well, unless the context clearly indicates otherwise. As used herein, expressions such as "at least one of," "one of," and "selected from," when preceding a list of elements, modify the entire list of elements and do not modify the individual elements of the list. It will be further understood that the terms "comprises" and/or "comprising," when used in this specification, specify the presence of stated features, integers, tasks, operations, elements, and/or components, but do not preclude the presence or addition of one or more other features, integers, tasks, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

As used herein, the phrases such as "a plan view" may refer to a view from top or from a direction normal to a display area of a display device.

As used herein, the terms "use," "using," and "used" may be considered synonymous with the terms "utilize," "utilizing," and "utilized," respectively.

Spatially relative terms, such as "beneath," "below," "lower," "above," "upper," "bottom," "top," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (e.g., rotated 90 degrees or at other orientations), and the spatially relative descriptors used herein should be interpreted accordingly.

It will be understood that when an element or layer is referred to as being "on," "connected to," "coupled to," or "adjacent to" another element or layer, it can be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

The above description is merely illustrative of the technical spirit or scope of the present disclosure, and a person of ordinary skill in the art will readily appreciate that various modifications and equivalent arrangements are possible without materially departing from the spirit and scope of the present disclosure. Furthermore, the embodiments of the present disclosure described above may be implemented separately or in combination with each other.

Therefore, the embodiments disclosed in the present disclosure are not intended to limit the technical spirit or scope of the present disclosure, but to explain them, and the range of the technical spirit or scope of the present disclosure is not limited by the aspects of embodiments of the present disclosure. The protection range of the present disclosure should be construed by the claims below, and all technical ideas within an equivalent range of thought should be construed as being included within the scope of the present disclosure.

What is claimed is:

1. A display device comprising:
   a substrate; and
   a display element part on the substrate, and comprising:
   a light emitting element configured to emit light in a display direction; and
   a bank pattern that protrudes in the display direction, wherein the bank pattern comprises:
- a first layer of the bank pattern comprising a first same semiconductor material as a first layer of the light emitting element; and
- a second layer of the bank pattern comprising a second same semiconductor material as a second layer of the light emitting element, the second same semiconductor material being different from the first same semiconductor material.

2. The display device of claim 1, wherein:
the first layer of the bank pattern comprises a first semiconductor pattern;
the second layer of the bank pattern comprises a second semiconductor pattern; and
the bank pattern further comprises an intermediate pattern between the first semiconductor pattern and the second semiconductor pattern and comprising a set material.

3. The display device of claim 2, wherein the light emitting element comprises
an intermediate layer between the first layer and the second layer and comprising the set material.

4. The display device of claim 3, further comprising a connection part on the substrate and comprising a metal.

5. The display device of claim 4, wherein the connection part comprises:
a first connection part between the bank pattern and the substrate; and
a second connection part between the light emitting element and the substrate.

6. The display device of claim 5, wherein the first connection part is electrically open with respect to the light emitting element.

7. The display device of claim 5, further comprising a transistor that is connected to the light emitting element by the second connection part.

8. The display device of claim 5, wherein the first semiconductor pattern is combined with the first connection part, and the first layer of the light emitting element is combined with the second connection part.

9. The display device of claim 1, further comprising a color convert part comprising a wavelength conversion pattern, wherein the wavelength conversion pattern is between adjacent bank patterns.

10. The display device of claim 9, further comprising:
a first light emitting area from which light having a first color is outputted;
a second light emitting area from which light having a second color is outputted; and
a reflector that is located within the first light emitting area and is configured to reflect light having the second color.

11. The display device of claim 10, wherein the reflector is not located within the second light emitting area.

12. The display device of claim 11, wherein the reflector is configured to reflect light having a wavelength of about 450 nm to about 495 nm.

13. The display device of claim 1, further comprising a reflective partition wall that is located at a side surface of the bank pattern and is configured to reflect light emitted from the light emitting element in the display direction.

14. The display device of claim 10, further comprising a color filter part on the color convert part, wherein the color filter part comprises:
a first color filter that is located within the first light emitting area and is configured to transmit the first color; and
a second color filter that is located within the second light emitting area and is configured to transmit the second color.

15. A display device comprising:
a substrate; and
a display element part on the substrate, and comprising:
a light emitting element configured to emit light in a display direction; and
a bank pattern that protrudes in the display direction,
wherein the bank pattern and the light emitting element comprise a same material, and
wherein the bank pattern comprises:
a first semiconductor pattern-comprising a first semiconductor material of a first type;
a second semiconductor pattern comprising a second semiconductor material of a second type different from the first type; and
an intermediate pattern between the first semiconductor pattern and the second semiconductor pattern and comprising a set material.

* * * * *